United States Patent
Moh

(10) Patent No.: US 8,242,857 B2
(45) Date of Patent: Aug. 14, 2012

(54) SINGLE SIDE BAND MIXER AND LOCAL OSCILLATOR HAVING THE SAME

(75) Inventor: Kyung-Goo Moh, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 107 days.

(21) Appl. No.: 12/836,294

(22) Filed: Jul. 14, 2010

(65) Prior Publication Data

US 2011/0043296 A1    Feb. 24, 2011

(30) Foreign Application Priority Data

Aug. 19, 2009  (KR) .................. 10-2009-0076633

(51) Int. Cl.
*H03C 1/60* (2006.01)
(52) U.S. Cl. ............... 332/170; 331/2; 331/25; 331/37; 331/40; 331/41; 455/313; 455/314
(58) Field of Classification Search ............... 331/2, 25, 331/37–43, 45; 332/170; 455/313, 318–320, 455/323, 333
See application file for complete search history.

(56) References Cited

U.S. PATENT DOCUMENTS 6,064,872 A   5/2000  Vice
6,462,626 B1  10/2002 Gharpurey

FOREIGN PATENT DOCUMENTS

JP    05-268281    10/1993

OTHER PUBLICATIONS

Leenaerts et al; "A SiGe BICMOS 1 ns Fast Hopping Frequency Synthesizer for UWB Radio"; 2005 IEEE International Solid-State Circuits Conference; Feb. 8, 2005; pp. 202, 203, 593.*

* cited by examiner

*Primary Examiner* — Joseph Chang
*Assistant Examiner* — Jeffrey Shin
(74) *Attorney, Agent, or Firm* — F. Chau & Associates, LLC

(57) ABSTRACT

A single side band (SSB) mixer includes an in-phase SSB mixer unit and a quadrature-phase SSB mixer unit. The in-phase SSB mixer unit generates an in-phase output current, and includes a first transformer load in which a portion of a quadrature-phase output current flows. The quadrature-phase SSB mixer unit generates the quadrature-phase output current, and includes a second transformer load in which a portion of the in-phase output current flows. The SSB mixer may be used in a wide frequency band without degrading frequency selectivity.

14 Claims, 10 Drawing Sheets

SINGLE SIDE BAND MIXER AND LOCAL OSCILLATOR HAVING THE SAME

CROSS-REFERENCE TO RELATED APPLICATION(S)

This application claims priority under 35 USC §119 to Korean Patent Application No. 2009-0076633, filed on Aug. 19, 2009 in the Korean Intellectual Property Office (KIPO), the contents of which are herein incorporated by reference in their entirety.

BACKGROUND

1. Technical Field

Example embodiments relate to a communication system, and more particularly to a communication system for synthesizing a signal using a local oscillator including a single side band mixer.

2. Description of the Related Art

As performance of mobile communication systems progress, frequency bands in mobile communication systems become various, and a structure of a local oscillator included in a mobile terminal becomes complicated due to such various frequency bands.

As an output frequency band of a single side band (SSB) mixer reduces, the number of SSB mixer blocks required in the local oscillator increases, a circuit design of the local oscillator becomes complicated and the size of the local oscillator increases.

SUMMARY

Example embodiments are directed to provide a single side band (SSB) mixer capable of being used in a wide frequency band without degrading frequency selectivity.

Example embodiments are directed to provide a local oscillator including the SSB mixer.

According to example embodiments, a SSB mixer includes an in-phase SSB mixer unit and a quadrature-phase SSB mixer unit. The in-phase SSB mixer unit generates an in-phase output current, and includes a first transformer load in which a portion of a quadrature-phase output current flows. The quadrature-phase SSB mixer unit generates the quadrature-phase output current, and includes a second transformer load in which a portion of the in-phase output current flows.

The portion of the quadrature-phase output current may flow in a secondary loop of a first transformer included in the first transformer load.

An effective inductance of a primary loop of the first transformer may be changed based on a degree of a magnetic coupling between the primary loop of the first transformer and the secondary loop of the first transformer.

The degree of the magnetic coupling may be controlled based on an intensity of the portion of the quadrature-phase output current flowing in the secondary loop of the first transformer.

The portion of the in-phase output current may flow in a secondary loop of a second transformer included in the second transformer load.

An effective inductance of a primary loop of the second transformer may be changed based on a degree of a magnetic coupling between the primary loop of the second transformer and the secondary loop of the second transformer.

The degree of the magnetic coupling may be controlled based on an intensity of the portion of the in-phase output current flowing in the secondary loop of the second transformer.

The in-phase SSB mixer unit may include a first multiplier connected to a first electrode and a second electrode of a primary loop of a first transformer included in the first transformer load, where the first multiplier multiplies a first in-phase signal and a second in-phase signal received from an external source, and a second multiplier connected to the first electrode and the second electrode of the primary loop of the first transformer included in the first transformer load, where the second multiplier multiplies a first quadrature-phase signal and a second quadrature-phase signal received from the external source.

The first in-phase signal and the first quadrature-phase signal may have a first frequency, and the second in-phase signal and the second quadrature-phase signal may have a second frequency different from the first frequency.

The quadrature-phase SSB mixer unit may include a first multiplier connected to a first electrode and a second electrode of a primary loop of a second transformer included in the second transformer load, where the first multiplier multiplies a first quadrature-phase signal and a second in-phase signal received from an external source, and a second multiplier connected to the first electrode and the second electrode of the primary loop of the second transformer included in the second transformer load, where the second multiplier multiplies a first in-phase signal and a second quadrature-phase signal received from the external source.

The first in-phase signal and the first quadrature-phase signal may have a first frequency, and the second in-phase signal and the second quadrature-phase signal may have a second frequency different from the first frequency.

According to example embodiments, a local oscillator includes a first phase locked loop (PLL) system, a second PLL system, and a single side band (SSB) mixer. The first PLL system generates a first in-phase signal and a first quadrature-phase signal having a first frequency. The second PLL system generates a second in-phase signal and a second quadrature-phase signal having a second frequency. The SSB mixer performs frequency synthesis of the first in-phase signal, the first quadrature-phase signal, the second in-phase signal and the second quadrature-phase signal to generate a third in-phase signal and a third quadrature-phase signal.

The SSB mixer may include an in-phase SSB mixer unit configured to generate an in-phase output current, where the in-phase SSB mixer unit includes a first transformer load in which a portion of a quadrature-phase output current flows, and a quadrature-phase SSB mixer unit configured to generate the quadrature-phase output current, where the quadrature-phase SSB mixer unit includes a second transformer load in which a portion of the in-phase output current flows.

The local oscillator may further include a frequency selection filter configured to select required frequency components among frequency components included in the third in-phase signal and the third quadrature-phase signal.

The local oscillator may further include a multiplexer configured to select a polarity of the second in-phase signal and the second quadrature-phase signal in response to a band selection signal received from an external source to generate a fourth in-phase signal and a fourth quadrature-phase signal, where the SSB mixer may perform frequency synthesis of the first in-phase signal, the first quadrature-phase signal, the fourth in-phase signal and the fourth quadrature-phase signal to generate the third in-phase signal and the third quadrature-phase signal.

BRIEF DESCRIPTION OF THE DRAWINGS

Illustrative, non-limiting example embodiments will be more clearly understood from the following detailed description in conjunction with the accompanying drawings.

DETAILED DESCRIPTION OF THE EMBODIMENTS

Figure 1:
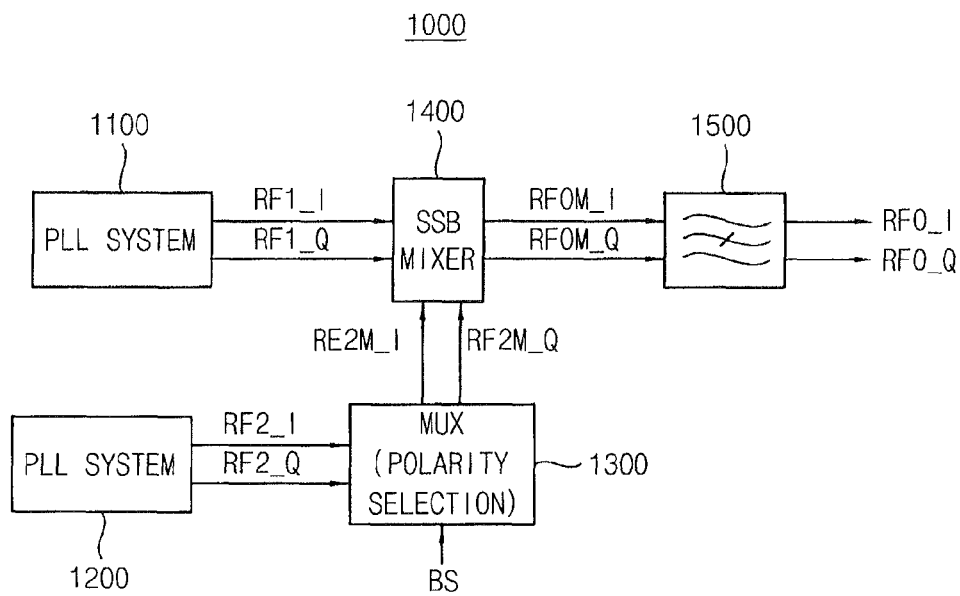
FIG. 1 is a block diagram illustrating a local oscillator including a single side band (SSB) mixer according to some example embodiments.

Various example embodiments will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a local oscillator including a single side band (SSB) mixer according to some example embodiments.

The local oscillator 1000 of FIG. 1 may be used in an ultra wide band (UWB) transceiver utilizing a multi-band orthogonal frequency division multiplexing (OFDM) method.

Referring to FIG. 1, the local oscillator 1000 includes a first phase locked loop (PLL) system 1100, a second PLL system 1200, a multiplexer (MUX) 1300, a SSB mixer 1400 and a frequency selection filter 1500.

The first PLL system 1100 generates a first in-phase signal RF1_I having a first frequency and a first quadrature-phase signal RF1_Q having the first frequency. The second PLL system 1200 generates a second in-phase signal RF2_I having a second frequency and a second quadrature-phase signal RF2_Q having the second frequency. The multiplexer 1300 receives the second in-phase signal RF2_I and the second quadrature-phase signal RF2_Q from the second PLL system 1200, generates a third in-phase signal RF2M_I and a third quadrature-phase signal RF2M_Q by selecting a polarity of the second in-phase signal RF2_I and the second quadrature-phase signal RF2_Q in response to a band selection signal (BS), and provides the SSB mixer 1400 with the third in-phase signal RF2M_I and the third quadrature-phase signal RF2M_Q. The SSB mixer 1400 generates a fourth in-phase signal RF2M_I and a fourth quadrature-phase signal RF2M_Q by performing frequency synthesis of the first in-phase signal RF1_I, the first quadrature-phase signal RF1_Q, the third in-phase signal RF2M_I and the third quadrature-phase signal RF2M_Q. The frequency selection filter 1500 generates a fifth in-phase signal RFO_I and a fifth quadrature-phase signal RFO_Q by selecting required frequency components among frequency components included in the fourth in-phase signal RFOM_I and the fourth quadrature-phase signal RFOM_Q.

Figure 2:
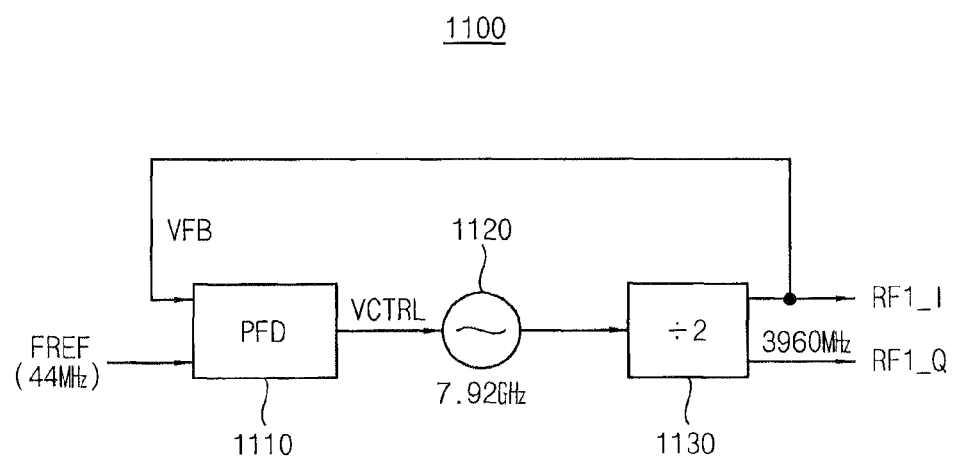
FIG. 2 is a block diagram illustrating an example of a first phase locked loop (PLL) system included in a local oscillator of FIG. 1.

FIG. 2 is a block diagram illustrating an example of a first PLL system included in a local oscillator of FIG. 1.

Referring to FIG. 2, the first PLL system 1100 may include a first phase frequency detector (PFD) 1110, a first oscillator 1120 and a first frequency divider 1130.

The first phase frequency detector 1110 may generate a voltage control signal (VCTRL) based on a feedback signal (VFB) and a reference signal (FREF) having a reference frequency. The first oscillator 1120 may generate an oscillating signal in response to the voltage control signal (VCTRL). The first frequency divider 1130 may generate the first in-phase signal RF1_I and the first quadrature-phase signal RF1_Q by dividing a frequency of the oscillating signal by two. The reference frequency may be 44 MHz, the first oscillator 1120 may generate the oscillating signal having a frequency of 7.92 GHz and the first frequency divider 1130 may generate the first in-phase signal RF1_I and the first quadrature-phase signal RF1_Q having a frequency of 3960 MHz.

Figure 3:
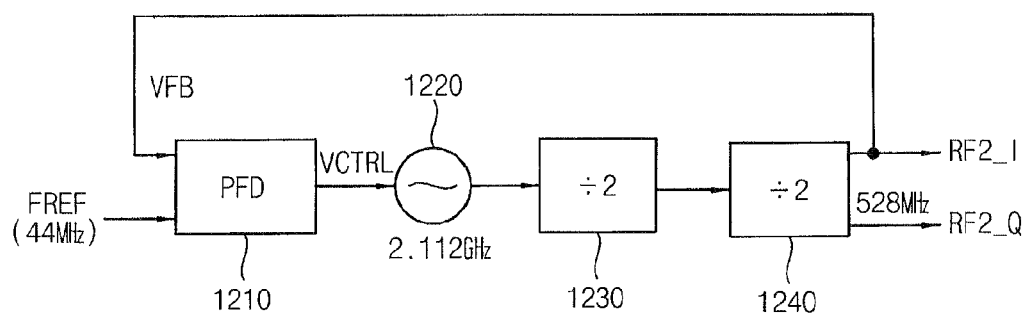
FIG. 3 is a block diagram illustrating an example of a second PLL system included in a local oscillator of FIG. 1.

FIG. 3 is a block diagram illustrating an example of a second PLL system included in a local oscillator of FIG. 1.

Referring to FIG. 3, the second PLL system 1200 may include a second phase frequency detector (PFD) 1210, a second oscillator 1220, a second frequency divider 1230 and a third frequency divider 1240.

The second phase frequency detector 1210 may generate a voltage control signal (VCTRL) based on a feedback signal (VFB) and a reference signal (FREF) having a reference frequency. The second oscillator 1220 may generate an oscillating signal in response to the voltage control signal (VCTRL). The second frequency divider 1230 may divide a frequency of the oscillating signal by two, and the third frequency divider 1240 may generate the second in-phase signal RF2_I and the second quadrature-phase signal RF2_Q by dividing a frequency of an output signal of the second frequency divider 1230 by two. The reference frequency may be 44 MHz, the second oscillator 1220 may generate the oscillating signal having a frequency of 2.112 GHz and the third frequency divider 1240 may generate the second in-phase signal RF2_I and the second quadrature-phase signal RF2_Q having a frequency of 528 MHz.

Figure 4:
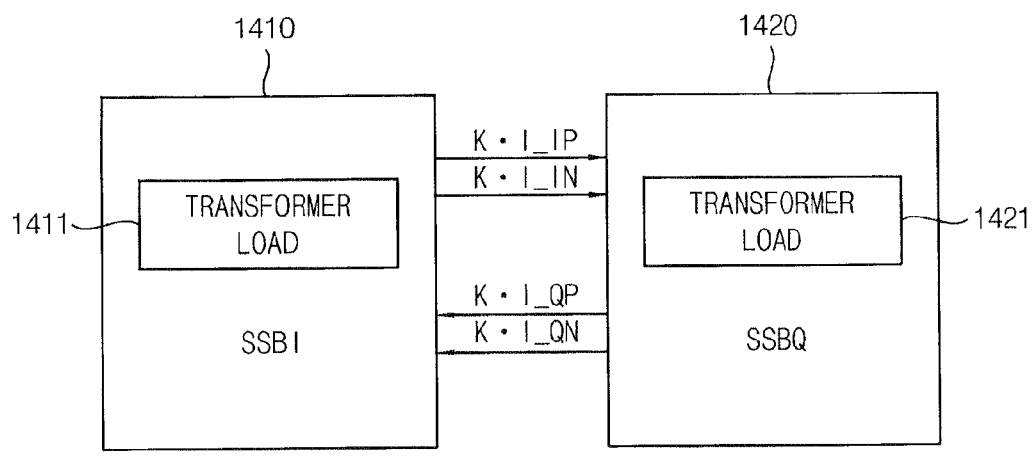
FIG. 4 is a block diagram illustrating an example of a SSB mixer included in a local oscillator of FIG. 1.

FIG. 4 is a block diagram illustrating an example of a SSB mixer included in a local oscillator of FIG. 1.

Referring to FIG. 4, the SSB mixer 1400 includes an in-phase SSB mixer unit (SSBI) 1410 and a quadrature-phase SSB mixer unit (SSBQ) 1420.

The in-phase SSB mixer unit 1410 generates in-phase output currents I_IP and I_IN, and the quadrature-phase SSB mixer unit 1420 generates quadrature-phase output currents I_QP and I_QN. The in-phase SSB mixer unit 1410 includes a first transformer load 1411 having a secondary loop in which portions of the quadrature-phase output currents k*I_QP and k*I_QN flow. The quadrature-phase SSB mixer unit 1420 includes a second transformer load 1421 having a secondary loop in which portions of the in-phase output currents k*I_IP and k*I_IN flow.

The SSB mixer 1400 may perform frequency synthesis of signals having a different frequency from each other using Equation 1 and Equation 2. Cosine wave signal may be generated using Equation 1 and sine wave signal may be generated using Equation 2. Phase difference between cosine wave signal and sine wave signal is substantially 90°. In general, cosine wave signal is referred to as an in-phase signal and sine wave signal is referred to as a quadrature-phase signal.

$$\cos((w1+w2)t)=\cos(w1t)*\cos(w2t)-\sin(w1t)*\sin(w2t)$$

$$\cos((w1-w2)t)=\cos(w1t)*\cos(w2t)+\sin(w1t)*\sin(w2t) \quad \text{[Equation 1]}$$

$$\sin((w1+w2)t)=\sin(w1t)*\cos(w2t)+\cos(w1t)*\sin(w2t)$$

$$\sin((w1-w2)t)=\sin(w1t)*\cos(w2t)-\cos(w1t)*\sin(w2t) \quad \text{[Equation 2]}$$

Figure 5:
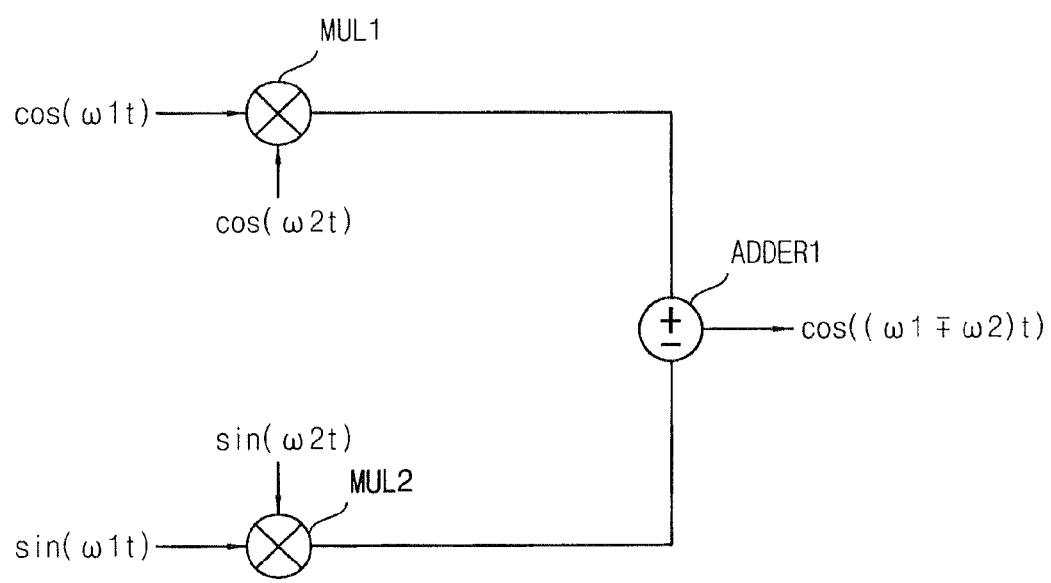
FIG. 5 is a circuit diagram for describing an example of frequency synthesis performed by a SSB mixer.

FIG. 5 is a circuit diagram for describing an example of frequency synthesis performed by a SSB mixer. A signal synthesis circuit of FIG. 5 performs frequency synthesis according to Equation 1.

In FIG. 5, $\cos(w1t)$ may represent the first in-phase signal RF1_I, $\sin(w1t)$ may represent the first quadrature-phase signal RF1_Q, $\cos(w2t)$ may represent the third in-phase signal RF2M_I, and $\sin(w2t)$ may represent the third quadrature-phase signal RF2M_Q.

Referring to FIG. 5, the signal synthesis circuit may include a first multiplier MUL1, a second multiplier MUL2 and an adder ADDER1.

The first multiplier MUL1 multiplies $\cos(w1t)$ and $\cos(w2t)$ which have a different frequency from each other. The second multiplier MUL2 multiplies $\sin(w1t)$ and $\sin(w2t)$ which have a different frequency from each other. The adder ADDER1 adds $\cos(w1t)*\cos(w2t)$, which is an output signal of the first multiplier MUL1, and $\sin(w1t)*\sin(w2t)$, which is an output signal of the second multiplier MUL2, or subtracts $\sin(w1t)*\sin(w2t)$ from $\cos(w1t)*\cos(w2t)$. The adder ADDER1 outputs $\cos((w1-w2)t)$ when the adder ADDER1 adds $\cos(w1t)*\cos(w2t)$ and $\sin(w1t)*\sin(w2t)$, and the adder ADDER1 outputs $\cos((w1+w2)t)$ when the adder ADDER1 subtracts $\sin(w1t)*\sin(w2t)$ from $\cos(w1t)*\cos(w2t)$.

Figure 6:
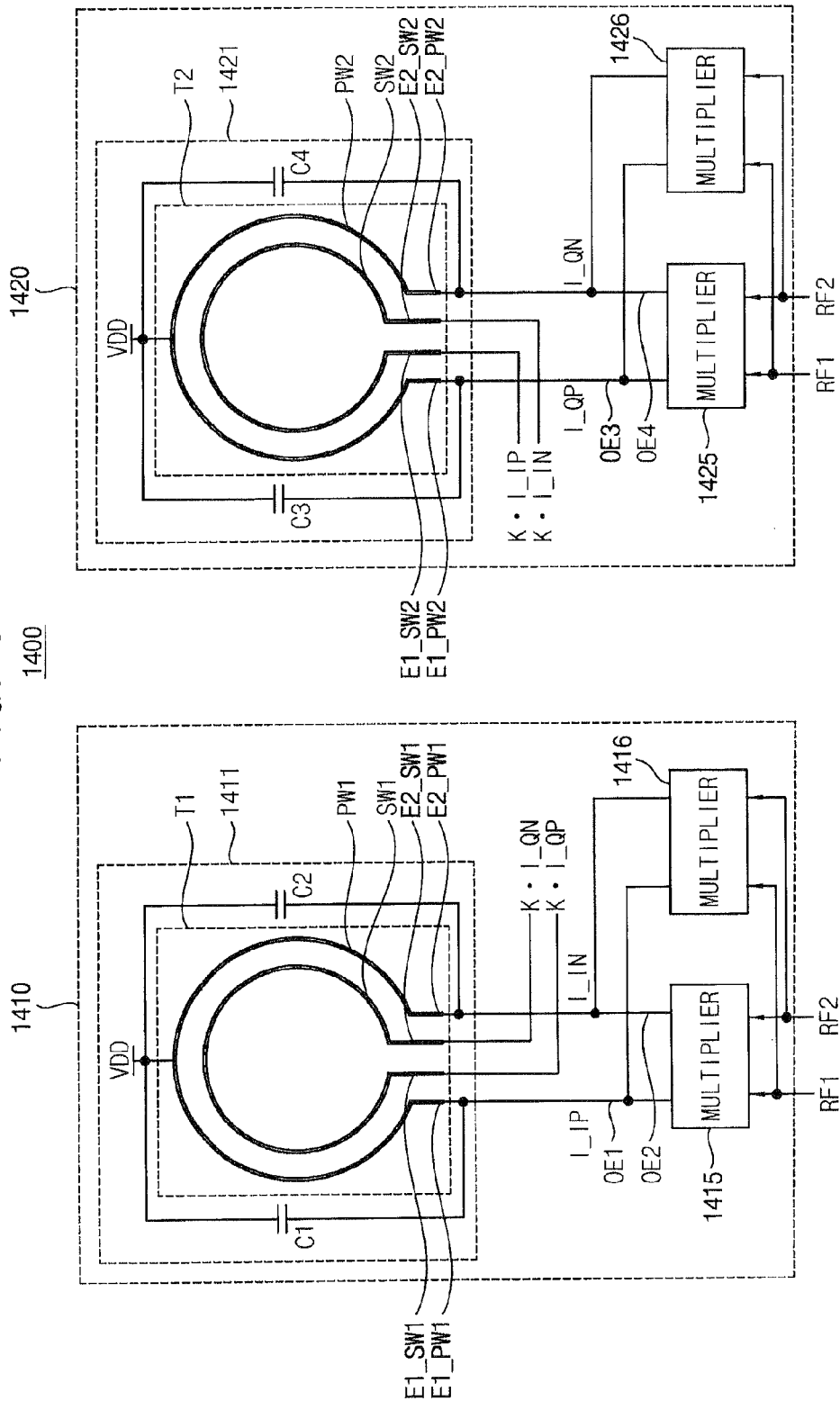
FIG. 6 is a diagram illustrating a SSB mixer of FIG. 4.

FIG. 6 is a diagram illustrating a SSB mixer of FIG. 4.

Referring to FIG. 6, the SSB mixer 1400 includes the in-phase SSB mixer unit 1410 and the quadrature-phase SSB mixer unit 1420.

The in-phase SSB mixer unit 1410 may include the first transformer load 1411, a third multiplier 1415 and a fourth multiplier 1416.

The first transformer load 1411 may include a first transformer T1, a first capacitor C1 and a second capacitor C2. The first transformer T1 may include a primary loop PW1 and a secondary loop SW1. The primary loop PW1 may include a first electrode E1_PW1 and a second electrode E2_PW1. The secondary loop SW1 may include a first electrode E1_SW1 and a second electrode E2_SW1.

The first electrode E1_PW1 and the second electrode E2_PW1 of the first transformer load 1411, output electrodes of the third multiplier 1415 and output electrodes of the fourth multiplier 1416 are connected to a first output electrode OE1 and a second output electrode OE2 of the in-phase SSB mixer unit 1410.

The quadrature-phase SSB mixer unit 1420 may include the second transformer load 1421, a fifth multiplier 1425 and a sixth multiplier 1426.

The second transformer load 1421 may include a second transformer T2, a third capacitor C3 and a fourth capacitor C4. The second transformer T2 may include a primary loop PW2 and a secondary loop SW2. The primary loop PW2 may include a first electrode E1_PW2 and a second electrode E2_PW2. The secondary loop SW2 may include a first electrode E1_SW2 and a second electrode E2_SW2.

The first electrode E1_PW2 and the second electrode E2_PW2 of the second transformer load 1421, output electrodes of the fifth multiplier 1425 and output electrodes of the sixth multiplier 1426 are connected to a first output electrode OE3 and a second output electrode OE4 of the quadrature-phase SSB mixer unit 1420.

The first electrode E1_PW1 of the primary loop PW1 of the first transformer T1, one output electrode of the third multiplier 1415 and one output electrode of the fourth multiplier 1416 are connected to the first output electrode OE1 of the in-phase SSB mixer unit 1410. The second electrode E2_PW1 of the primary loop PW1 of the first transformer T1, the other output electrode of the third multiplier 1415 and the other output electrode of the fourth multiplier 1416 are connected to the second output electrode OE2 of the in-phase SSB mixer unit 1410. A first input signal RF1 having the first frequency and a second input signal RF2 having the second frequency may be inputted to the third multiplier 1415 and the fourth multiplier 1416. The first input signal RF 1 may include the first in-phase signal RF and the first quadrature-phase signal RF1_Q, and the second input signal RF2 may include the third in-phase signal RF2M_I and the third quadrature-phase signal RF2M_Q. The first electrode E1_SW2 of the secondary loop SW2 of the second transformer T2 may be connected to the first output electrode OE1 of the in-phase SSB mixer unit 1410, and the second electrode E2_SW2 of the secondary loop SW2 of the second transformer T2 may be connected to the second output electrode OE2 of the in-phase SSB mixer unit 1410.

The first electrode E1_PW2 of the primary loop PW2 of the second transformer T2, one output electrode of the fifth multiplier 1425 and one output electrode of the sixth multiplier 1426 are connected to the first output electrode OE3 of the quadrature-phase SSB mixer unit 1420. The second electrode E2_PW2 of the primary loop PW2 of the second transformer T2, the other output electrode of the fifth multiplier 1425 and the other output electrode of the sixth multiplier 1426 are connected to the second output electrode OE4 of the quadrature-phase SSB mixer unit 1420. The first input signal RF1 having the first frequency and the second input signal RF2 having the second frequency may be inputted to the fifth multiplier 1425 and the sixth multiplier 1426. The first input signal RF1 may include the first in-phase signal RF1_I and the first quadrature-phase signal RF1_Q, and the second input signal RF2 may include the third in-phase signal RF2M_I and the third quadrature-phase signal RF2M_Q. The first electrode E1_SW1 of the secondary loop SW1 of the first transformer T1 may be connected to the first output electrode OE3 of the quadrature-phase SSB mixer unit 1420, and the second electrode E2_SW1 of the secondary loop SW1 of the first transformer T1 may be connected to the second output electrode OE4 of the quadrature-phase SSB mixer unit 1420.

As illustrated in FIG. 6, portions of the quadrature-phase output currents k*I_QP and k*I_QN are provided to the secondary loop SW1 of the first transformer load 1411 included in the in-phase SSB mixer unit 1410, and portions of the in-phase output currents k*I_IP and k*I_IN are provided to the secondary loop SW2 of the second transformer load 1421 included in the quadrature-phase SSB mixer unit 1420. The portions of the quadrature-phase output currents k*I_QP and k*I_QN and the portions of the in-phase output currents k*I_IP and k*I_IN may be referred to as coupling currents. Effective inductances of the first transformer load 1411 and the second transformer load 1421 may be changed by controlling intensities of the coupling currents.

Figure 7:
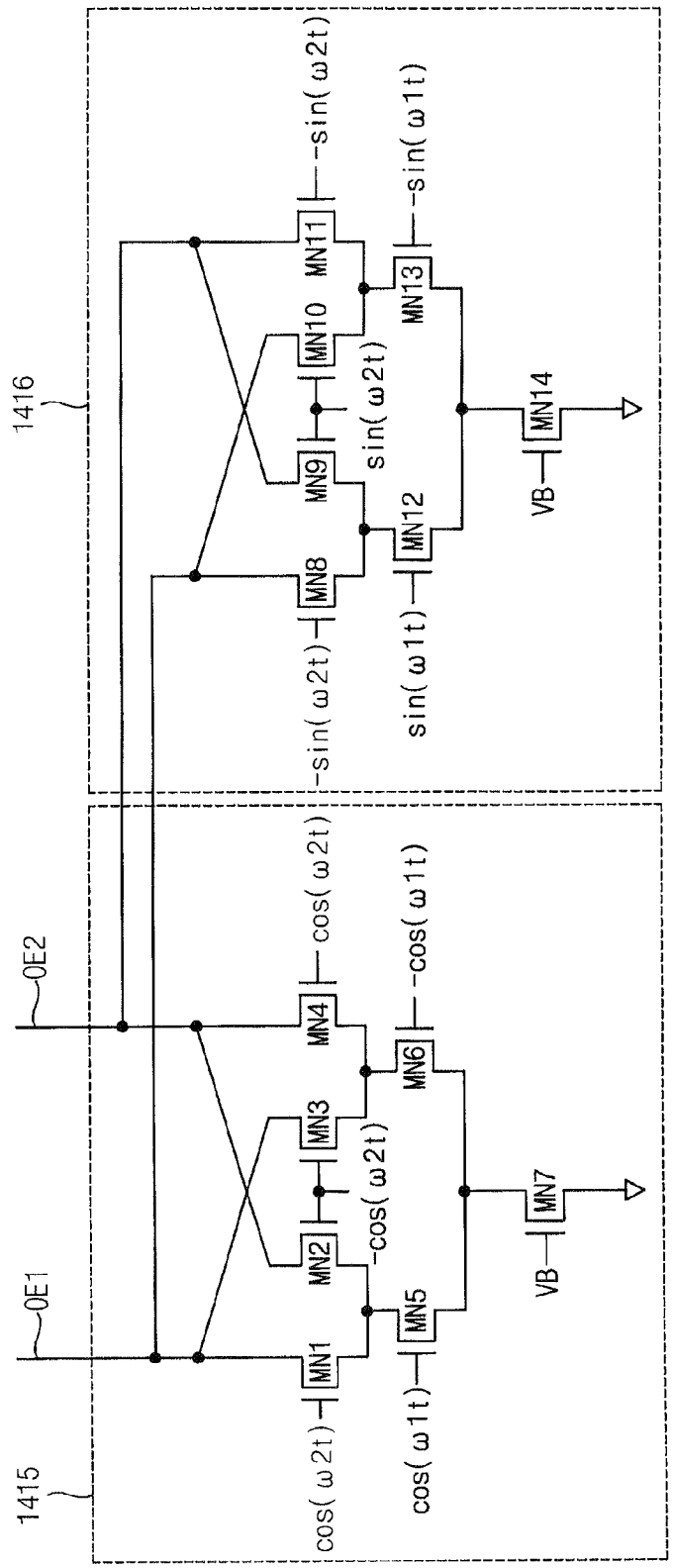
FIG. 7 is a circuit diagram illustrating an example of multipliers included in an in-phase SSB mixer unit of FIG. 6.

FIG. 7 is a circuit diagram illustrating an example of multipliers included in an in-phase SSB mixer unit of FIG. 6. The multipliers 1415 and 1416 of FIG. 7 perform frequency synthesis according to Equation 1.

Referring to FIG. 7, the third multiplier 1415 and the fourth multiplier 1416 have the same circuit design, and are connected to the first output electrode OE1 and the second output electrode OE2 of the in-phase SSB mixer unit 1410.

The third multiplier 1415 may include n-type metal oxide semiconductor (NMOS) transistors MN1, MN2, MN3, MN4, MN5, MN6 and MN7, and the fourth multiplier 1416 may include NMOS transistors MN8, MN9, MN10, MN11, MN12, MN13 and MN14. A bias voltage VB may be applied to a gate of an NMOS transistor MN7 and to a gate of an NMOS transistor MN14.

$Cos(w1t)$ may be applied to a gate of an NMOS transistor MN5, and $-cos(w1t)$ may be applied to a gate of an NMOS transistor MN6. $Cos(w2t)$ may be applied to a gate of an NMOS transistor MN1 and to a gate of an NMOS transistor MN4, and $-cos(w2t)$ may be applied to a gate of an NMOS transistor MN2 and to a gate of an NMOS transistor MN3.

$Sin(w1t)$ may be applied to a gate of an NMOS transistor MN12, and $-sin(w1t)$ may be applied to a gate of an NMOS transistor MN13. $-Sin(w2t)$ may be applied to a gate of an NMOS transistor MN8 and to a gate of an NMOS transistor MN11, and $sin(w2t)$ may be applied to a gate of an NMOS transistor MN9 and to a gate of an NMOS transistor MN10.

Currents flowing through the third multiplier 1415 and the fourth multiplier 1416 may be added or subtracted to generate the in-phase output currents I_IP and I_IN since the third multiplier 1415 and the fourth multiplier 1416 are commonly connected to the first output electrode OE1 and the second output electrode OE2 of the in-phase SSB mixer unit 1410.

Figure 8:
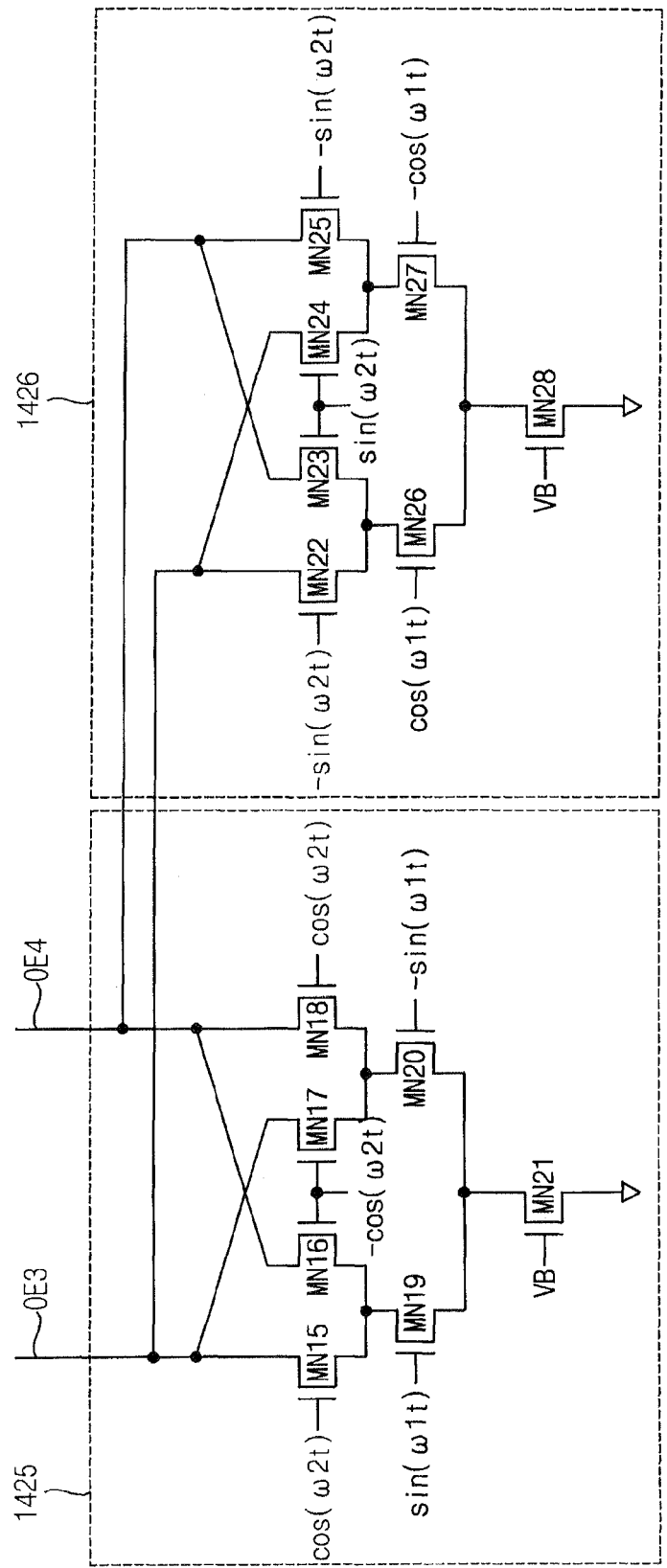
FIG. 8 is a circuit diagram illustrating an example of multipliers included in a quadrature-phase SSB mixer unit of FIG. 6.

FIG. 8 is a circuit diagram illustrating an example of multipliers included in a quadrature-phase SSB mixer unit of FIG. 6. The multipliers 1425 and 1426 of FIG. 8 perform frequency synthesis according to Equation 2.

Referring to FIG. 8, the fifth multiplier 1425 and the sixth multiplier 1426 have the same circuit design, and are connected to the first output electrode OE3 and the second output electrode OE4 of the quadrature-phase SSB mixer unit 1420.

The fifth multiplier 1425 may include NMOS transistors MN15, MN16, MN17, MN18, MN19, MN20 and MN21, and the sixth multiplier 1426 may include NMOS transistors MN22, MN23, MN24, MN25, MN26, MN27 and MN28. The bias voltage VB may be applied to a gate of an NMOS transistor MN21 and to a gate of an NMOS transistor MN28.

$Sin(w1t)$ may be applied to a gate of an NMOS transistor MN19, and $-sin(w1t)$ may be applied to a gate of an NMOS transistor MN20. $Cos(w2t)$ may be applied to a gate of an NMOS transistor MN15 and to a gate of an NMOS transistor MN18, and $-cos(w2t)$ may be applied to a gate of an NMOS transistor MN16 and to a gate of an NMOS transistor MN17.

$Cos(w1t)$ may be applied to a gate of an NMOS transistor MN26, and $-cos(w1t)$ may be applied to a gate of an NMOS transistor MN27. $-Sin(w2t)$ may be applied to a gate of an NMOS transistor MN22 and to a gate of an NMOS transistor MN25, and $sin(w2t)$ may be applied to a gate of an NMOS transistor MN23 and to a gate of an NMOS transistor MN24.

Currents flowing through the fifth multiplier 1425 and the sixth multiplier 1426 may be added or subtracted to generate the quadrature-phase output currents I_QP and I_QN since the fifth multiplier 1425 and the sixth multiplier 1426 are commonly connected to the first output electrode OE3 and the second output electrode OE4 of the quadrature-phase SSB mixer unit 1420.

Hereinafter, changing effective inductances of the first transformer load 1411 included in the in-phase SSB mixer unit 1410 and the second transformer load 1421 included in the quadrature-phase SSB mixer unit 1420 by controlling a degree of a magnetic coupling of the first transformer load 1411 and the second transformer load 1421 will be described with reference to FIGS. 9 and 10.

Figure 9:
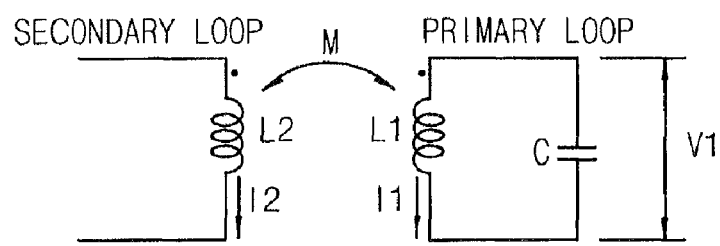
FIG. 9 is a circuit diagram illustrating an example of an equivalent circuit of a transformer load included in a SSB mixer according to some example embodiments.

FIG. 9 is a circuit diagram illustrating an example of an equivalent circuit of a transformer load included in a SSB mixer according to some example embodiments.

The transformer 1431 may represent the first transformer load 1411 included in the in-phase SSB mixer unit 1410 and the second transformer load 1421 included in the quadrature-phase SSB mixer unit 1420.

Referring to FIG. 9, the transformer 1431 may include a primary loop having a first inductance L1 and a secondary loop having a second inductance L2. A mutual inductance between the primary loop and the secondary loop is M. A capacitor C may be connected to the primary loop.

When the transformer 1431 is the first transformer load 1411 included in the in-phase SSB mixer unit 1410, portions of the quadrature-phase output currents k*I_QP and k*I_QN may flow in the secondary loop of the transformer 1431.

Referring to FIG. 9, a voltage V1 of the primary loop may be represented as Equation 3.

$$V1 = jwL1*i1 + jwM*i2 = -i1/(jwC) \quad \text{[Equation 3]}$$

A current of the primary loop is i1, and a current of the secondary loop is i2.

When i2=Ka*i1 (Ka is a real number), a phase difference between i1 and i2 is substantially 0° or 180°, so that an effective inductance of the primary loop may be increased or decreased. For example, the effective inductance of the primary loop may be changed from L1 to L1+Ka*M.

Figure 10:
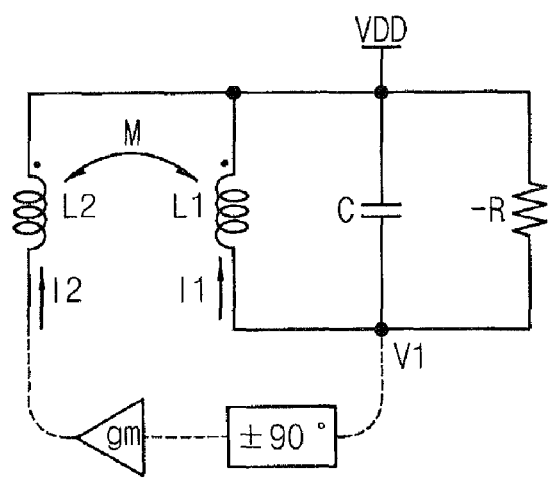
FIG. 10 is a circuit diagram for describing a change of an effective inductance of a primary loop through a magnetic coupling.

FIG. 10 is a circuit diagram for describing a change of an effective inductance of a primary loop through magnetic coupling. The transformer load 1441 of FIG. 10 represents an example of a transformer load used in a quadrature voltage controlled oscillator (VCO).

Referring to FIG. 10, the transformer 1441 may include a primary loop having a first inductance L1 and a secondary loop having a second inductance L2. A mutual inductance between the primary loop and the secondary loop is M. A capacitor C and a negative resistance –R may be connected to the primary loop in parallel. The negative resistance –R is used as an example for a VCO, and a positive resistance may be used in other embodiments.

In FIG. 10, a block gm and a block ±90° represent effects caused by multipliers connected to a transformer of a SSB mixer. For example, the block gm represents a voltage-current conversion, and the block ±90° represents a phase difference of 90° between an in-phase current and a quadrature-phase current. A phase difference between a voltage induced through magnetic coupling and a current of an inductor is substantially 90°. Therefore, a phase difference between i1 and i2 may become 0° or 180°.

A resonance frequency f0 of the transformer 1431 of FIG. 9 may be represented as Equation 4.

$$f0 = (1/2\pi)*(1/\mathrm{sqrt}((L1+Ka*M)*C)) \quad \text{[Equation 4]}$$

Referring to Equation 4, when i2=Ka*i1, the resonance frequency f0 of the transformer 1431 of FIG. 9 may be controlled by Ka.

In the SSB mixer 1400 of FIG. 6, portions of the quadrature-phase output currents k*I_QP and k*I_QN flow in the secondary loop SW1 of the first transformer load 1411 included in the in-phase SSB mixer unit 1410, and portions of the in-phase output currents k*I_IP and k*I_IN flow in the secondary loop SW2 of the second transformer load 1421 included in the quadrature-phase SSB mixer unit 1420. Since an effective inductance of a load of the local oscillator 1000 may be changed by controlling intensities of the coupling currents, the local oscillator 1000 may be used in a wide frequency band without degrading frequency selectivity.

Figure 11:
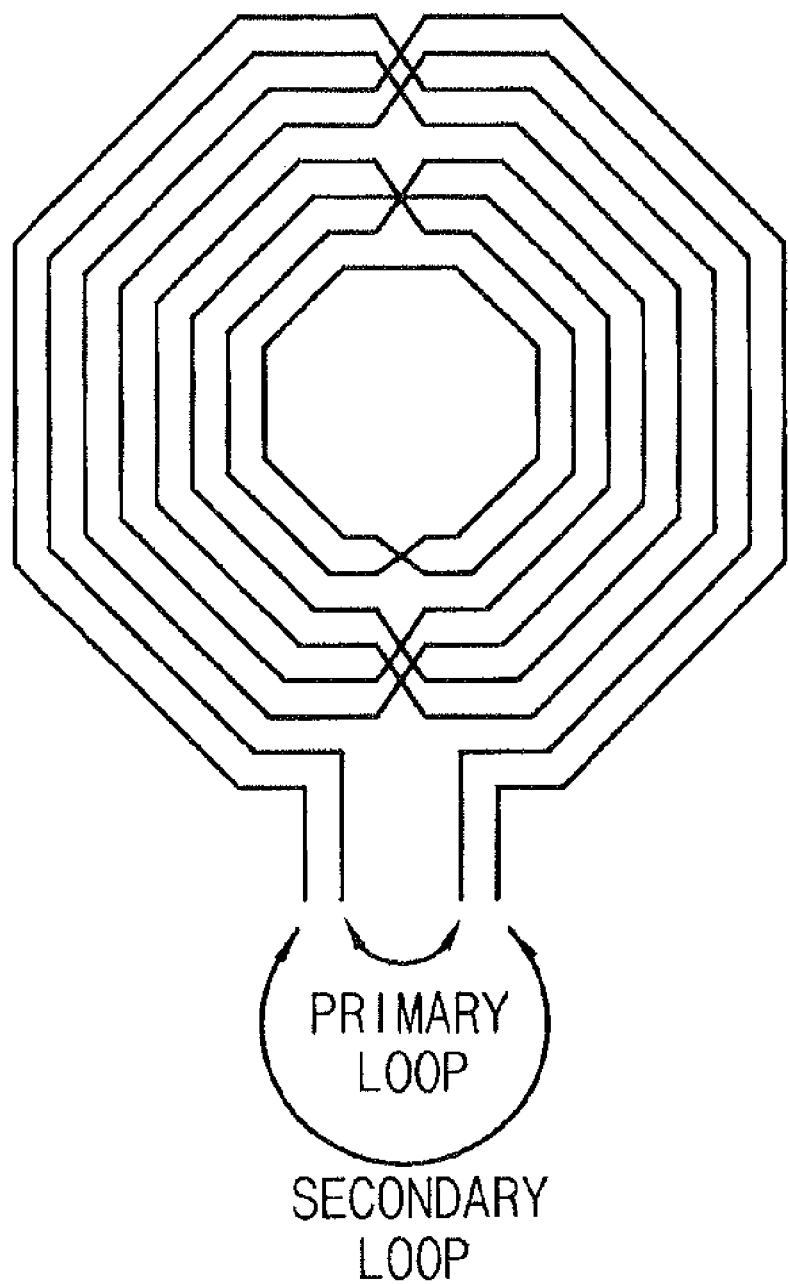
FIG. 11 is a diagram illustrating an example of a transformer included in a SSB mixer of FIG. 6 formed on a semiconductor integrated circuit as a monolithic transformer.

FIG. 11 is a diagram illustrating an example of a transformer included in a SSB mixer of FIG. 6 formed on a semiconductor integrated circuit as a monolithic transformer.

Monolithic transformers may be divided into stacked transformers, concentric transformers and inter-wound transformers according to an arrangement of a primary loop and a secondary loop. The monolithic transformer of FIG. 11 is an inter-wound transformer, and the primary loop and the second loop are inter-wound each other.

Figure 12:
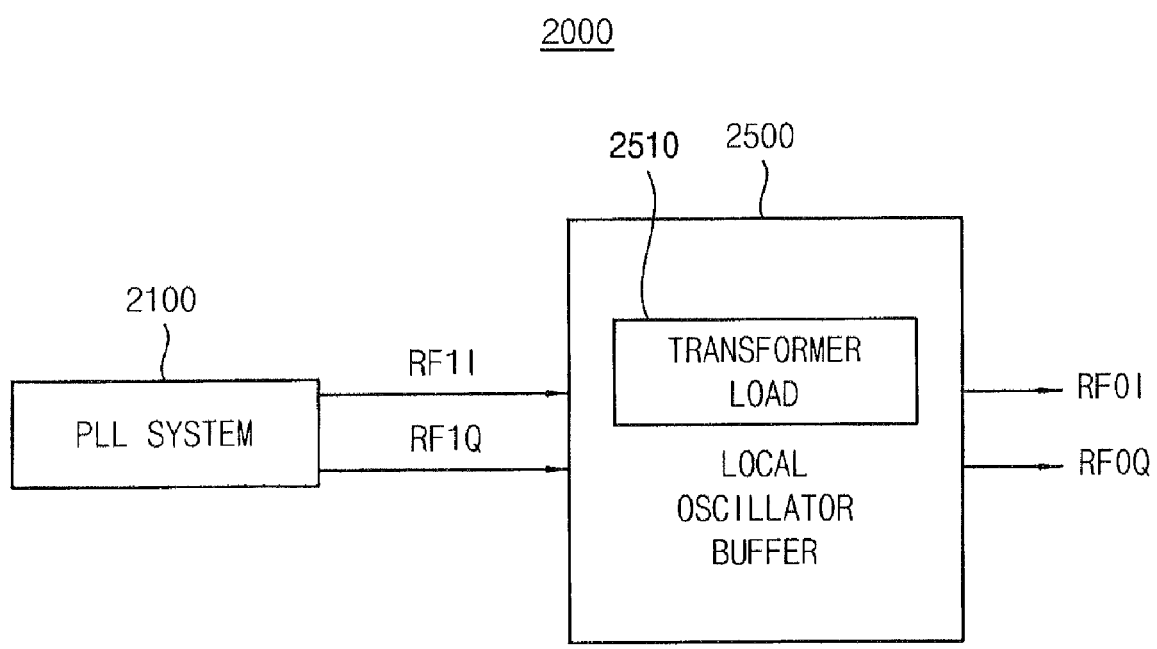
FIG. 12 is a block diagram illustrating a local oscillator including a local oscillator buffer having a transformer load according to some example embodiments.

The present inventive concept may be applied to a local oscillator buffer buffering a quadrature signal. FIG. 12 is a block diagram illustrating a local oscillator including a local oscillator buffer having a transformer load according to some example embodiments.

Referring to FIG. 12, the local oscillator 2000 includes a PLL system 2100 and a local oscillator buffer 2500.

The PLL system 2100 generates a first in-phase signal RF1I having a first frequency and a first quadrature-phase signal RF having the first frequency. The local oscillator buffer 2500 buffers the first in-phase signal RF1I and the first quadrature-phase signal RF1Q, and generates a second in-phase signal RFOI and a second quadrature-phase signal RFOQ.

The local oscillator buffer 2500 may have a similar structure to the SSB mixer 1400 illustrated in FIG. 4, may include a transformer buffer 2510, and may operate with the transformer buffer 2510 similar to the SSB mixer 1400 illustrated in FIG. 4. For example, portions of quadrature-phase output currents may be provided to a secondary loop of a first transformer load included in an in-phase SSB mixer unit, and portions of in-phase output currents may be provided to a secondary loop of a second transformer load included in a quadrature-phase SSB mixer unit. The portions of the quadrature-phase output currents and the portions of the in-phase output currents may be referred to as coupling currents. Since an effective inductance of a load of the local oscillator buffer 2500 may be changed by controlling intensities of the coupling currents, the local oscillator 2000 may be used in a wide frequency band without degrading frequency selectivity.

Figure 13:
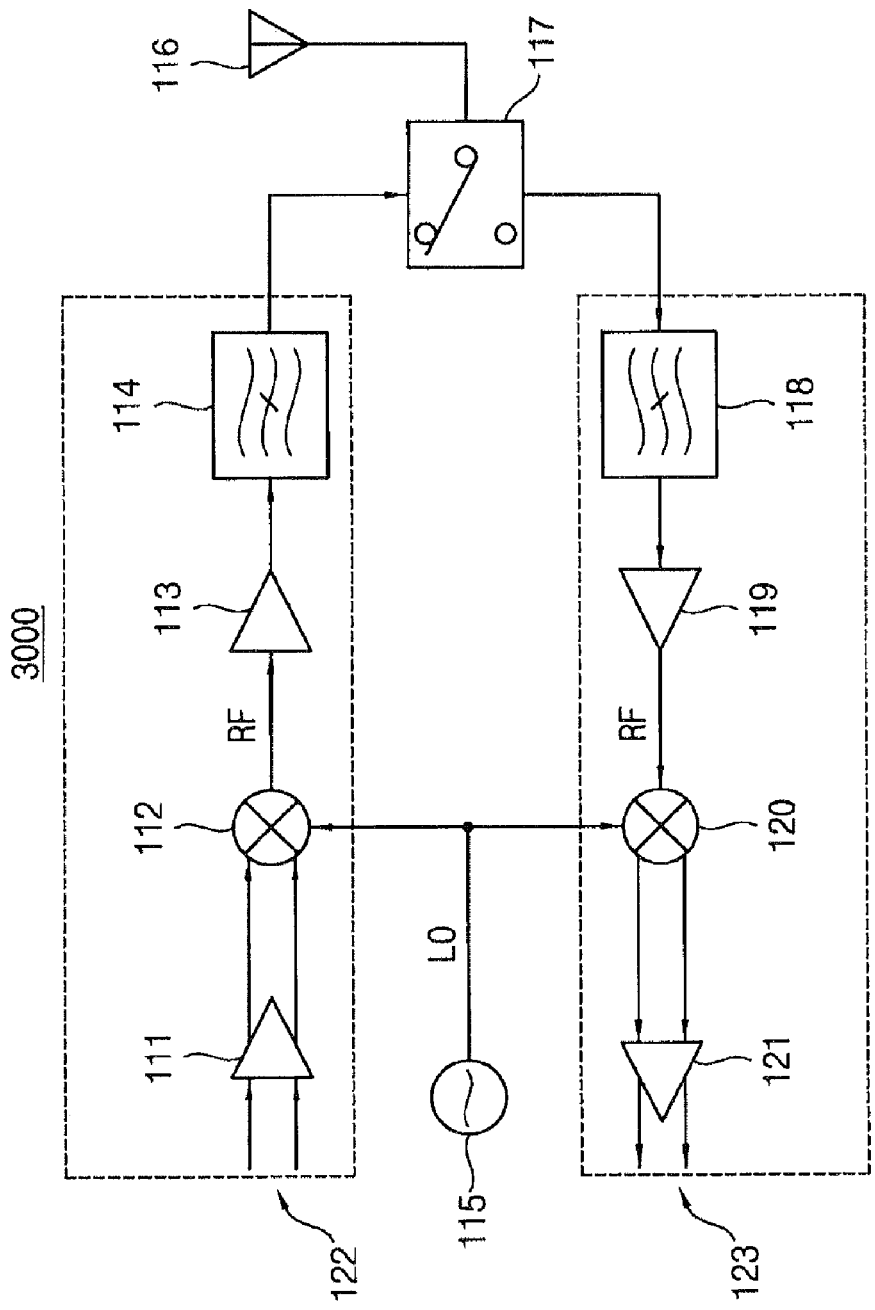
FIG. 13 is a circuit diagram illustrating an example of a communication system including a local oscillator according to some example embodiments.

FIG. 13 is a circuit diagram illustrating an example of a communication system including a local oscillator according to some example embodiments.

Referring to FIG. 13, the communication system 3000 includes a local oscillator 115, a transmitting unit 122, a switch 117, an antenna 116 and a receiving unit 123.

The local oscillator 115 may be the local oscillator 1000 of FIG. 1, and may generate an oscillating signal (LO).

The transmitting unit 122 may include a first amplifier 111, a first mixer 112, a second amplifier 113 and a first filter 114. The first amplifier 111 may amplify a base band signal. The first mixer 112 may synthesize a radio frequency signal (RF) using an output signal of the first amplifier 111, which is a baseband signal, and the oscillating signal (LO). The second amplifier 113 may amplify the radio frequency signal (RF). The first filter 114 may filter an output signal of the second amplifier 113, which is an amplified radio frequency signal. An output signal of the first filter 114, which is a filtered radio frequency signal, may be transmitted through the switch 117 and the antenna 116.

The receiving unit 123 may include a second filter 118, a third amplifier 119, a second mixer 120 and a fourth amplifier 121. The second filter 118 may filter a signal received through the antenna 116 and the switch 117. The third amplifier 119 may generate a radio frequency signal (RF) by amplifying an output signal of the second filter 118. The second mixer 120 may synthesize a baseband signal using the radio frequency signal RF and the oscillating signal (LO). The fourth amplifier 121 may amplify an output signal of the second mixer 120, which is the baseband signal.

As described above, portions of quadrature-phase output currents may be provided to a secondary loop of a first transformer load included in an in-phase SSB mixer unit, and portions of in-phase output currents may be provided to a secondary loop of a second transformer load included in a quadrature-phase SSB mixer unit. The portions of the quadrature-phase output currents and the portions of the in-phase output currents may be referred to as coupling currents. Since an effective inductance of a load of the local oscillator 115 may be changed by controlling intensities of the coupling currents, the local oscillator 115 may be used in a wide frequency band without degrading frequency selectivity.

Example embodiments of the present inventive concept may be used in a communication system, particularly in a local oscillator included in the communication system.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A single side band (SSB) mixer comprising:
    an in-phase SSB mixer unit configured to generate an in-phase output current, the in-phase SSB mixer unit including a first transformer load in which a portion of a quadrature-phase output current flows; and
    a quadrature-phase SSB mixer unit configured to generate the quadrature-phase output current, the quadrature-phase SSB mixer unit including a second transformer load in which a portion of the in-phase output current flows.

2. The SSB mixer of claim 1, wherein the portion of the quadrature-phase output current flows in a secondary loop of a first transformer included in the first transformer load.

3. The SSB mixer of claim 2, wherein an effective inductance of a primary loop of the first transformer is changed based on a degree of a magnetic coupling between the primary loop of the first transformer and the secondary loop of the first transformer.

4. The SSB mixer of claim 3, wherein the degree of the magnetic coupling is controlled based on an intensity of the portion of the quadrature-phase output current flowing in the secondary loop of the first transformer.

5. The SSB mixer of claim 1, wherein the portion of the in-phase output current flows in a secondary loop of a second transformer included in the second transformer load.

6. The SSB mixer of claim 5, wherein an effective inductance of a primary loop of the second transformer is changed based on a degree of a magnetic coupling between the primary loop of the second transformer and the secondary loop of the second transformer.

7. The SSB mixer of claim 6, wherein the degree of the magnetic coupling is controlled based on an intensity of the portion of the in-phase output current flowing in the secondary loop of the second transformer.

8. The SSB mixer of claim 1, wherein the in-phase SSB mixer unit includes:
    a first multiplier connected to a first electrode and a second electrode of a primary loop of a first transformer included in the first transformer load, the first multiplier multiplying a first in-phase signal and a second in-phase signal received from an external source; and
    a second multiplier connected to the first electrode and the second electrode of the primary loop of the first transformer included in the first transformer load, the second multiplier multiplying a first quadrature-phase signal and a second quadrature-phase signal received from the external source.

9. The SSB mixer of claim 8, wherein the first in-phase signal and the first quadrature-phase signal have a first frequency, and the second in-phase signal and the second quadrature-phase signal have a second frequency different from the first frequency.

10. The SSB mixer of claim 1, wherein the quadrature-phase SSB mixer unit includes:
    a first multiplier connected to a first electrode and a second electrode of a primary loop of a second transformer included in the second transformer load, the first multiplier multiplying a first quadrature-phase signal and a second in-phase signal received from an external source; and
    a second multiplier connected to the first electrode and the second electrode of the primary loop of the second transformer included in the second transformer load, the second multiplier multiplying a first in-phase signal and a second quadrature-phase signal received from the external source.

11. The SSB mixer of claim 10, wherein the first in-phase signal and the first quadrature-phase signal have a first frequency, and the second in-phase signal and the second quadrature-phase signal have a second frequency different from the first frequency.

12. A local oscillator comprising:
    a first phase locked loop (PLL) system configured to generate a first in-phase signal and a first quadrature-phase signal having a first frequency;
    a second PLL system configured to venerate a second in-phase signal and a second quadrature-phase signal having a second frequency; and
    a single side band (SSB) mixer configured to perform frequency synthesis of the first in-phase signal, the first quadrature-phase signal, the second in-phase signal and the second quadrature-phase signal to generate a third in-phase signal and a third quadrature-phase signal, wherein the SSB mixer includes:
    an in-phase SSB mixer unit configured to generate an in-phase output current, the in-phase SSB mixer unit including a first transformer load in which a portion of a quadrature-phase output current flows; and
    a quadrature-phase SSB mixer unit configured to generate the quadrature-phase output current, the quadrature-phase SSB mixer unit including a second transformer load in which a portion of the in-phase output current flows.

13. The local oscillator of claim 12, further comprising:
    a frequency selection filter configured to select required frequency components among frequency components included in the third in-phase signal and the third quadrature-phase signal.

14. The local oscillator of claim 13, further comprising:
    a multiplexer configured to select a polarity of the second in-phase signal and the second quadrature-phase signal in response to a band selection signal received from an external source to generate a fourth in-phase signal and a fourth quadrature-phase signal,
    wherein the SSB mixer performs frequency synthesis of the first in-phase signal, the first quadrature-phase signal, the fourth in-phase signal and the fourth quadrature-phase signal to generate the third in-phase signal and the third quadrature-phase signal.

* * * * *